US009905634B2

(12) United States Patent
Schwagmann et al.

(10) Patent No.: US 9,905,634 B2
(45) Date of Patent: Feb. 27, 2018

(54) POWER SEMICONDUCTOR DEVICE EDGE STRUCTURE

(71) Applicant: Infineon Technologies AG, Neubiberg (DE)

(72) Inventors: Andre Schwagmann, Tuebingen (DE); Elmar Falck, Hohenbrunn (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/188,695

(22) Filed: Jun. 21, 2016

(65) Prior Publication Data

US 2017/0005163 A1 Jan. 5, 2017

(30) Foreign Application Priority Data

Jul. 3, 2015 (DE) .................. 10 2015 212 464

(51) Int. Cl.
*H01L 29/06* (2006.01)
*H01L 29/10* (2006.01)
(Continued)

(52) U.S. Cl.
CPC ...... *H01L 29/0619* (2013.01); *H01L 21/2253* (2013.01); *H01L 21/263* (2013.01);
(Continued)

(58) Field of Classification Search
CPC .............. H01L 29/063; H01L 29/0638; H01L 29/0696; H01L 29/1095; H01L 29/739;
(Continued)

(56) References Cited

U.S. PATENT DOCUMENTS

2008/0265276 A1* 10/2008 Noda .................. H01L 29/0619
257/139
2013/0264674 A1 10/2013 Mizushima
(Continued)

OTHER PUBLICATIONS

Office Action communication of the German Patent and Trademark Office for Appln. Ser. No. 102015212464.9, dated Mar. 23, 2016.

*Primary Examiner* — Christine Enad
(74) *Attorney, Agent, or Firm* — Baker Botts L.L.P.

(57) ABSTRACT

A semiconductor device having a first load terminal, a second load terminal and a semiconductor body is presented. The semiconductor body comprises an active region configured to conduct a load current between the first load terminal and the second load terminal and a junction termination region surrounding the active region. The semiconductor body includes a drift layer arranged within both the active region and the junction termination region and having dopants of a first conductivity type at a drift layer dopant concentration of equal to or less than $10^{14}$ cm$^{-3}$; a body zone arranged in the active region and having dopants of a second conductivity type complementary to the first conductivity type and isolating the drift layer from the first load terminal; a guard zone arranged in the junction termination region and having dopants of the second conductivity type and being configured to extend a depletion region formed by a transition between the drift layer and the body zone; a field stop zone arranged adjacent to the guard zone, the field stop zone having dopants of the first conductivity type at a field stop zone dopant concentration that is higher than the drift layer dopant concentration by a factor of at least 2; a low doped zone arranged adjacent to the field stop zone, the low doped zone having dopants of the first conductivity type at a dopant concentration that is lower than the drift layer dopant concentration by a factor of at least 1.5, wherein the body zone, the guard zone, the field stop zone and the low doped
(Continued)

zone are arranged in the semiconductor body such that they exhibit a common depth range (DR) of at least 1 µm along a vertical extension direction (Z).

20 Claims, 5 Drawing Sheets (51) Int. Cl.
H01L 21/265 (2006.01)
H01L 21/225 (2006.01)
H01L 21/263 (2006.01)
H01L 29/66 (2006.01)
H01L 29/739 (2006.01)
H01L 29/78 (2006.01)

(52) U.S. Cl.
CPC ...... *H01L 21/26506* (2013.01); *H01L 29/063* (2013.01); *H01L 29/0638* (2013.01); *H01L 29/0696* (2013.01); *H01L 29/1095* (2013.01); *H01L 29/66325* (2013.01); *H01L 29/66674* (2013.01); *H01L 29/7391* (2013.01); *H01L 29/7393* (2013.01); *H01L 29/7801* (2013.01)

(58) Field of Classification Search
CPC ............. H01L 29/7397; H01L 21/2253; H01L 21/263; H01L 21/26506
See application file for complete search history.

(56) References Cited

U.S. PATENT DOCUMENTS

| 2014/0097488 | A1* | 4/2014 | Schulze | H01L 21/223 257/330 |
| 2015/0179441 | A1* | 6/2015 | Onozawa | H01L 29/36 257/109 |
| 2016/0027866 | A1* | 1/2016 | Yoshikawa | H01L 29/8611 257/484 |
| 2016/0300904 | A1* | 10/2016 | Antoniou | H01L 29/404 |

* cited by examiner

POWER SEMICONDUCTOR DEVICE EDGE STRUCTURE

CROSS-REFERENCE TO RELATED APPLICATION

This application claims priority to German Application Serial No. 102015212464.9 filed Jul. 3, 2015 and entitled "Power Semiconductor Device Edge Structure."

TECHNICAL FIELD

This specification refers to embodiments of a semiconductor device and to embodiments of a semiconductor device processing method. In particular, this specification refers to embodiments of a semiconductor device exhibiting a certain lateral variation of the dopant concentration in an edge structure of the semiconductor device and to embodiments of a corresponding semiconductor device processing method.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

The voltage blocking capability of such a power semiconductor device is secured essentially by a sufficiently sized and appropriately doped drift layer of the active region. However, also the junction termination region surrounding the active region of such power semiconductor device has to be designed carefully so as to avoid breakdowns, e.g., due to high electrical fields. After the junction termination region has been processed, the junction termination region and the edge region surrounding the junction termination region may further be sealed off with, e.g., a passivation layer. Since the junction termination region and the edge region usually do not contribute to the active area of a power semiconductor device, it is generally aimed to keep these regions as small as possible.

SUMMARY

According to an embodiment, a semiconductor device is presented. The semiconductor device has a first load terminal, a second load terminal and a semiconductor body, wherein the semiconductor body comprises an active region configured to conduct a load current between the first load terminal and the second load terminal and a junction termination region surrounding the active region, and wherein the semiconductor body includes a drift layer arranged within both the active region and the junction termination region and having dopants of a first conductivity type at a drift layer dopant concentration of equal to or less than $10^{14}$ cm$^{-3}$; a body zone arranged in the active region and having dopants of a second conductivity type complementary to the first conductivity type and isolating the drift layer from the first load terminal; a guard zone arranged in the junction termination region and having dopants of the second conductivity type and being configured to extend a depletion region formed by a transition between the drift layer and the body zone; a field stop zone arranged adjacent to the guard zone, the field stop zone having dopants of the first conductivity type at a field stop zone dopant concentration that is higher than the drift layer dopant concentration by a factor of at least 2; a low doped zone arranged adjacent to the field stop zone, the low doped zone having dopants of the first conductivity type at a dopant concentration that is lower than the drift layer dopant concentration by a factor of at least 1.5, wherein the body zone, the guard zone, the field stop zone and the low doped zone are arranged in the semiconductor body such that they exhibit a common depth range of at least 1 µm along a vertical extension direction.

According to a further embodiment, a further semiconductor device is presented. The further semiconductor device has a first load terminal, a second load terminal and a semiconductor body, the semiconductor body comprising an active region configured to conduct a load current between the first load terminal and the second load terminal and a junction termination region surrounding the active region, wherein the semiconductor body further includes a drift layer arranged within both the active region and the junction termination region and having dopants of a first conductivity type at a drift layer dopant concentration; a body zone arranged in the active region and having dopants of a second conductivity type complementary to the first conductivity type and isolating the drift layer from the first load terminal; a guard zone arranged in the junction termination region and having dopants of the second conductivity type and being configured to extend a depletion region formed by a transition between the drift layer and the body zone; a field stop zone arranged adjacent to the guard zone, the field stop zone having dopants of the first conductivity type; a low doped zone arranged adjacent to the field stop zone, the low doped zone comprising a proton-doped semiconductor material having dopants of the first conductivity type at a dopant concentration that is lower than the drift layer dopant concentration, and wherein the body zone, the guard zone, the field stop zone and the low doped zone are arranged in the semiconductor body such that they exhibit a common depth range of at least 1 µm along a vertical extension direction.

According to another embodiment, a semiconductor device processing method is presented. The method comprises providing a semiconductor device having a first load terminal, a second load terminal and a semiconductor body, the semiconductor body comprising an active region configured to conduct a load current between the first load terminal and the second load terminal and a junction termination region surrounding the active region, a drift layer arranged within both the active region and the junction termination region and having dopants of a first conductivity type at a drift layer dopant concentration; a body zone arranged in the active region and having dopants of a second conductivity type complementary to the first conductivity type and isolating the drift layer from the first load terminal; a guard zone arranged in the junction termination region and having dopants of the second conductivity type and being configured to extend a depletion region formed by a transition between the drift layer and the body zone; and a field stop zone arranged adjacent to the guard zone, the field stop zone having dopants of the first conductivity type. The method further includes creating, within a region of the semiconductor body arranged adjacent to the field stop zone, a low doped zone having dopants of the first conductivity type at a dopant concentration that is lower than the drift layer dopant concentration by carrying out at least a proton implantation, wherein the body zone, the guard zone, the field stop zone and the low doped zone are arranged in the semiconductor body such that they exhibit a common depth range of at least 1 μm along a vertical extension direction.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor body. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be a vertical direction that is perpendicular to both the first lateral direction X and the second lateral direction Y.

In this specification, n-doped is referred to as "first conductivity type" while p-doped is referred to as "second conductivity type". Alternatively, opposite dopant relations can be employed so that the first conductivity type can be p-doped and the second conductivity type can be n-doped.

Further, within this specification, the term "dopant concentration" may refer to an integral dopant concentration or, respectively, to a mean dopant concentration or to a sheet charge carrier concentration of a specific semiconductor region or semiconductor zone, such as a semiconductor region within a trench. Thus, e.g., a statement saying that a specific semiconductor region (or zone or layer) exhibits a certain dopant concentration that is higher or lower as compared to a dopant concentration of another semiconductor region (or zone or layer) may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

Specific embodiments described in this specification pertain to, without being limited thereto, a power semiconductor device that may be used within a power converter or a power supply. For example, the power semiconductor device may comprise one or more power semiconductor cells, such as a monolithically integrated diode cell, and/or a monolithically integrated transistor cell, and/or a monolithically integrated IGBT cell, and/or a monolithically integrated MOS Gated Diode (MGD) cell, and/or a monolithically integrated MOSFET cell and/or derivatives thereof. Such diode cells and such transistor cells may be integrated in a power semiconductor module.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 5 V, more typically 15 V and above.

Figure 1:
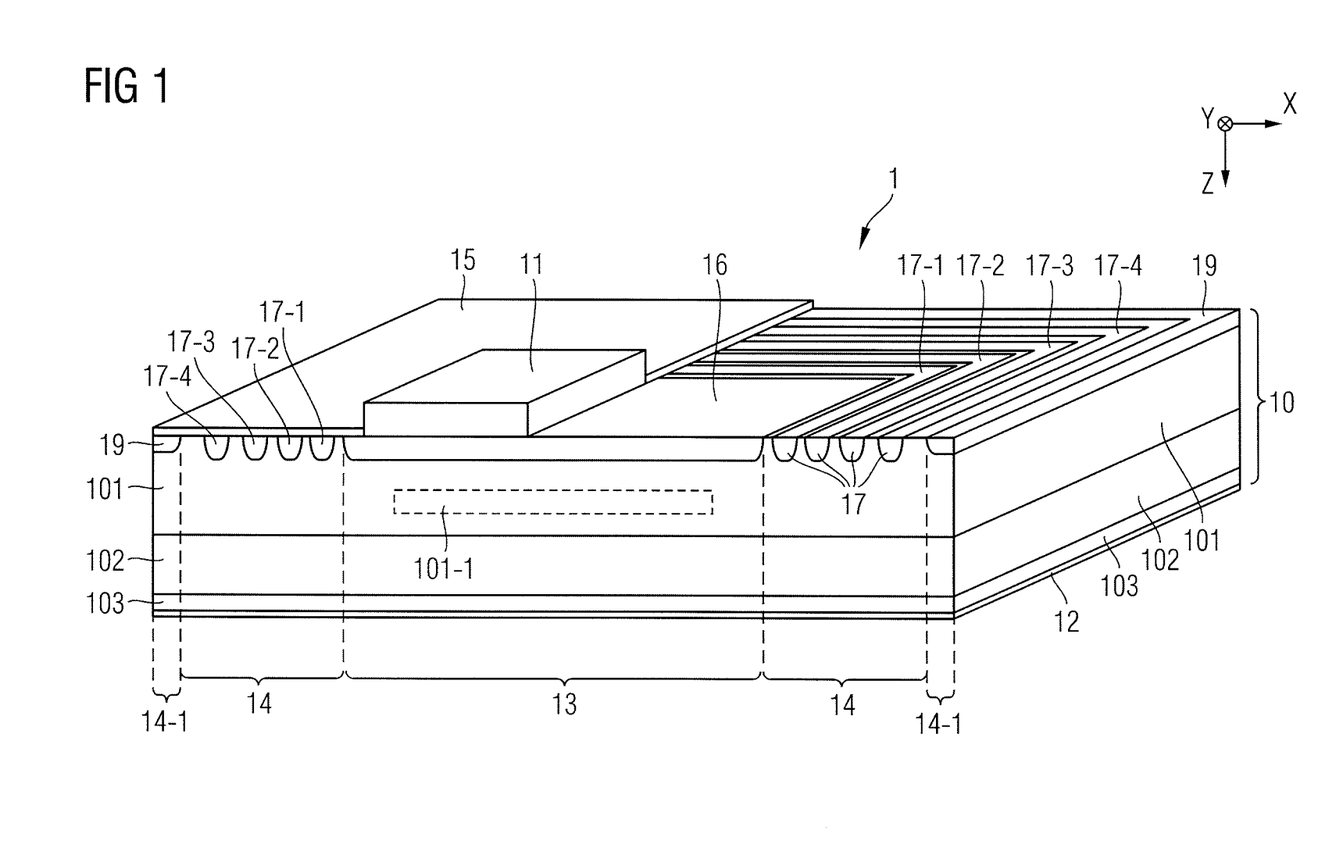
FIG. 1 schematically illustrates a section of a perspective cross-sectional view of a semiconductor device according to one or more embodiments.

FIG. 1 schematically illustrates a section of a perspective cross-sectional view of a semiconductor device 1 according to one or more embodiments. The semiconductor device 1 has a first load terminal 11 and a second load terminal 12 and a semiconductor body 10. For example, the first load terminal 11 may be mounted on the surface of the semiconductor body 10, e.g., on the frontside. Further, the second load terminal 12 may be arranged at another surface of the semiconductor body 10, e.g., at the backside.

In the embodiment illustrated in FIG. 1, the semiconductor device 1 exhibits a vertical set-up, implying that the semiconductor body 10 is arranged in between the first load terminal 11 and the second load terminal 12 and that a load current may flow between the first load terminal 11 and the second load terminal 12 along a vertical extension direction Z.

For conducting the load current between the first load terminal 11 and the second load terminal 12, the semiconductor device 1 may comprise an active region 13. This active region 13 can be configured to conduct the load current. For example, the active region 13 may comprise a plurality of transistor cells and/or one or more diode cell that are configured to conduct the load current when the semiconductor device 1 is in a conducting state. Further, the semiconductor device 1 may also be configured to block a voltage and to prevent flow of a load current when being in a non-conducting state. In the embodiment illustrated in FIG. 1, the semiconductor device 1 exhibits a basic diode structure by way of example, which will be explained in more detail below. However, it shall be understood that the semiconductor device may also exhibit another structure, for example a MOSFET or IGBT or RC-IGBT structure (not illustrated) in accordance with other embodiments.

Each of the first load terminal 11 and the second load terminal 12 can comprise a metal. For example, the second load terminal 12 is formed by a backside metallization layer, as illustrated in FIG. 1. For setting the semiconductor device 1 in the conducting-state or, respectively, in the off-state, the semiconductor device 1 may also comprise a control terminal (not illustrated) for receiving a corresponding control signal from external of the semiconductor device 1.

The front side surface of the semiconductor body 10 may be covered, at least partially, by a passivation layer 15.

Regarding now in more detail the exemplarily configuration of the semiconductor body 10, the active region 13 may be surrounded by a junction termination region 14. For example, the semiconductor device comprises an edge region 14-1 that terminates the semiconductor device 1 in both the first lateral direction X and in a second lateral direction Y. The junction termination region 14 and the edge region 14-1 may form an edge structure of the semiconductor device 1.

The active region 13 may be arranged within a central region of the semiconductor device 1, such that the active region 13 is spatially isolated from the edge region 14-1 by means of the junction termination region 14. For example, the junction termination region 14 and the edge region 14-1 are both not configured to conduct the load current. For example, these regions 14 and 14-1 do thus include only a few or even no diode cell or transistor cell.

The semiconductor body 10 may comprise one or more layers that extend both within the active region 13 and the junction termination region 14 and the edge region 14-1. For example, a semiconductor device 1 comprises a drift layer 101 that is arranged within the regions 13, 14 and 14-1 and that may have dopants of the first conductivity type at a drift layer dopant concentration. In one embodiment, the drift layer dopant concentration is equal or less to $10^{14}$ cm$^{-3}$. For example, the drift layer dopant concentration may amount to, e.g., $0.5 \times 10^{14}$ cm$^{-3}$, $0.7 \times 10^{14}$ cm$^{-3}$, $0.8 \times 10^{14}$ cm$^{-3}$, or even less than $0.5 \times 10^{14}$ cm$^{-3}$. In an embodiment, the drift layer 101 is a weakly doped n-drift layer 101. In other embodiments, the drift layer dopant concentration can be greater than $10^{14}$ cm$^{-3}$.

Below the drift layer 101, there may be arranged a buffer layer 102 (also commonly referred to as "field stop layer") that may also extend along the active region 13, the junction termination region 14 and the edge region 14-1. This buffer layer 102 may also comprise dopants of the first conductivity type at a buffer layer dopant concentration that may be higher than the drift layer dopant concentration. In accordance with an embodiment, the buffer layer is an n$^+$-buffer layer 102.

Further, below the buffer layer 102, there may be arranged a semiconductor contact layer 103 that also extends along the active region 13, the junction termination region 14 and the edge region 14-1. For example, the semiconductor contact layer 103 may be in contact with both the buffer layer 102 and the second load terminal 12, as illustrated in FIG. 1. The semiconductor contact layer 103 may exhibit the dopants of the first conductivity type or the second conductivity type at a semiconductor contact layer dopant concentration that is even higher than the dopant concentration of the buffer layer 102. For example, the semiconductor contact layer 103 may be a n$^{++}$-semiconductor contact layer or a p$^+$-emitter layer.

Besides these semiconductor layers 101, 102 and 103, the semiconductor device 1 may also comprise one or more semiconductor zones that may be exclusively arranged either within the active region 13 or within the junction termination region 14 or, respectively, within the edge region 14-1. For example, the semiconductor device 1 comprises a semiconductor body zone 16 that is arranged in the active region 13 and that has dopants of a second conductivity type complementary to the first conductivity type.

In an embodiment, the body zone 16 is electrically coupled to the first load terminal 11. For example, the body zone 16 may be in contact with a first load terminal 11. The body zone 16 can be arranged within the semiconductor body 10 such that it isolates the drift layer 101 from the first load terminal 11. The body zone 16 may be a p-doped semiconductor zone.

A transition between the body zone 16 and the drift layer 101 may form a pn-junction. Thus, a depletion region may be formed by the transition between the drift layer 101 and the body zone 16. For example, the pn-junction is configured to block the blocking voltage if the semiconductor device 1 is in the blocking state. The voltage blocking capability of the semiconductor device 1 is, in accordance with an embodiment, secured essentially by sufficiently sizing and appropriately doping the drift layer 101 and/or the body zone 16.

The semiconductor device 1 can further comprise a guard zone 17 that is arranged in the junction termination region 14 and that has dopants of the second conductivity type. The guard zone 17 can be configured to extend the depletion region that is formed by the transition between the drift layer 101 and the body zone 16. For example, the depletion region is extended by the guard zone at least along the first lateral direction X.

In an embodiment, the guard zone 17 comprises one or more guard subzones 17-1 to 17-4. In the embodiment illustrated in FIG. 1, the guard zone 17 of the semiconductor device 1 comprises four of such guard subzones 17-1 to 17-4. However, it shall be understood that in accordance with other embodiments, the guard zone 17 may also comprise only one guard subzone 17-1, only two guard subzones 17-1 and 17-2, or only three guard subzones 17-1 to 17-3 or more than four guard subzones 17-1 to 17-4, such as five to ten guard subzones or even more than ten guard subzones, wherein each of said guard subzones has dopants of the second conductivity type. For example, the guard subzones 17-1 to 17-4 may be spatially isolated from each other.

The guard subzones 17-1 to 17-4 may each exhibit the form of a ring-shaped well, such as a closed ring, as schematically illustrated in FIG. 1. Each of the guard subzones 17-1 to 17-4 may surround the active region 13 and may be arranged in proximity to the surface of the semiconductor body 10. The ring-shaped form must not necessarily exhibit a strictly circular course, but may also, e.g., be established by four substantially linear sections, two of which can be aligned along the first lateral direction X and the other two of which can be aligned along the second lateral direction Y, as schematically illustrated in FIG. 1.

In accordance with a further embodiment, the guard zone 17 may exhibit the form of a spiral (not illustrated) having a number of turns, wherein each of the turns may form a guard subzone and may surround the active region 13. In another embodiment, the guard zone 17 comprises at least two guard subzones, wherein, in contrast to the schematic illustration of FIG. 1, each of the at least two guard subzones may exhibit the form of a non-closed ring-shaped well. For example, each of the at least two non-closed ring-shaped wells exhibits a plurality of interrupt regions, e.g., formed by the respective sections of the drift layer 101, which may be n-doped, wherein the at least two non-closed ring-shaped wells can be arranged offset to one another such that every path along a radial direction from the center of the body region 16 to the edge region 14-1 encounters a section of at least one of the at least two guard subzones, which may be p-doped.

For example, by means of the guard zone 17, the depletion region can be extended along a radial direction pointing from the center of the active region 13 to the edge region 14-1, e.g., along the first lateral direction X and along the second lateral direction Y. For example, the guard zone 17 can be configured to prevent break downs due to high electrical fields. In other words, the guard zone 17 can be configured to modify the paths of the electrical field formed by the pn-junction between the body zone 16 and the drift layer 101, i.e., the path of the depletion region.

Further, the semiconductor device 1 may comprise a channel stopper zone 19 that is arranged in the edge region 14-1 and that has dopants of the second conductivity type. The channel stopper zone 19 can be configured to prevent the currents of conducting channels within the junction termination region 14 and/or within the edge region 14-1. Also, the channel stopper zone 19 may exhibit the form of a ring-shaped well that surrounds both the body zone 16 and the guard zone 17.

For example, the guard zone 17 is electrically floating; i.e., the guard zone 17 is not electrically connected to a defined electrical potential. Further, the channel stopper zone 19 may be electrically connected to the second load terminal 12; i.e., the channel stopper zone 19 and the second load terminal 12 may exhibit substantially the same electrical potential.

Each of the aforementioned zones 16, 17 and 19 can be spatially isolated from each other, as illustrated in FIG. 1. In other words, along the radial direction, e.g., at least along the first lateral direction X, there may be arranged a semiconductor region exhibiting dopants of the first conductivity type in between respective two of said zones 16, 17 and 19. For example, the guard zone 17 is spatially separated from the body zone 16 by an n-doped region, and the guard subzones 17-1 to 17-4 are spatially isolated from each other by means of n-doped semiconductor regions and the channel stopper zone 19 is spatially isolated from the guard zone 17 by another n-doped semiconductor region.

Further, the body zone 16, the guard zone 17 and the channel stopper zone 19 can be arranged within the semiconductor body 10 such they exhibit a common depth range of at least 1 µm along the vertical extension direction Z. As illustrated in FIG. 1, each of the aforementioned semiconductor zones 16, 17 and 19 are arranged near to the surface of the semiconductor body 10. For example, each of the semiconductor zones 16, 17 and 19 extend into the semiconductor body 10 along the vertical extension direction Z by at least 1 µm, such as at least 2 µm.

The total extension of the semiconductor body 10 along the vertical extension direction Z may amount to at least 20 µm, to at least 50 µm, to at least 100 µm or to even more than 150 µm.

The total extension along the radial direction (which is identical to the first lateral direction X in FIG. 1) of each of the guard subzones 17-1 to 17-4 may amount to at least 1 µm, or to at least 3 µm, or to at least 5 µm, or to at least 10 µm, or to even more than 20 µm. For example, the total extension of the channel stopper zone 19 along the radial direction may amount to at least at least 1 µm, or to at least 3 µm, or to at least 5 µm, or to at least 10 µm, or to even more than 20 µm.

As elaborated above, the active region 13 of the semiconductor device 1 may comprise one or more diode cells and/or a number of transistor cells, even though FIG. 1 only schematically depicts a structure of a diode by way of example. Thus, in deviation from the exemplary and schematic set-up of the active region 13 illustrated in FIG. 1, the semiconductor device 1 may also exhibit an active region 13 that is structured so as to form a MOSFET, an IGBT, a reverse conducting IGBT, a MOS gated diode (MGD) and derivatives of such power semiconductor components. In any event, however, there may be provided the body zone 16 and the drift layer 101 for forming at least one of the aforementioned structures of a power semiconductor component.

Irrespective of the remaining set-up of the active region 13, certain aspects of some embodiments discussed in more detail below are related to the semiconductor region that isolates the guard zone 17 from the body zone 16, and/or a second guard subzone (e.g., guard subzone 17-2) from a first guard subzone (e.g., guard subzone 17-1), and/or the channel stopper zone 19 from the guard zone 17. These aspects will now be described in more detail with respect to the remaining drawings.

Figure 2A:
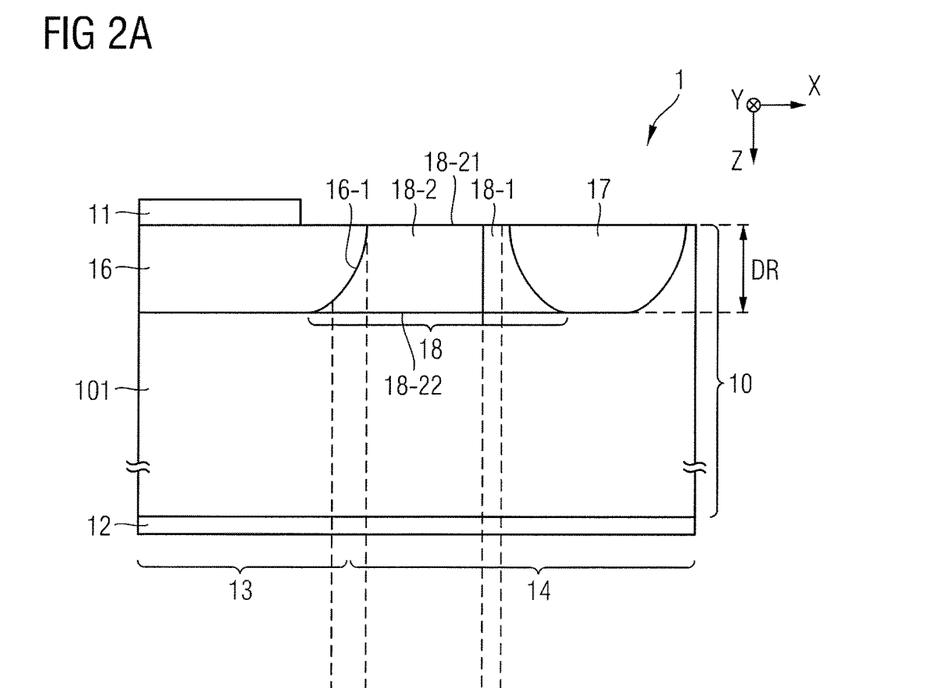
FIG. 2A schematically illustrates a section of a vertical cross-section of a semiconductor device according to one or more embodiments.

FIG. 2A schematically and exemplarily illustrates a section of a vertical cross-section of a semiconductor device 1. In accordance with the embodiment illustrated in FIG. 2A, the junction termination region 14 of the semiconductor device 1 further comprises a field forming zone 18 arranged in between the body zone 16 and the guard zone 17, e.g., adjacent to the guard zone 17 and adjacent to the body zone 16.

The field forming zone 18 may comprise a field stop zone 18-1 that is arranged adjacent to the guard zone 17 and that is heading towards the body zone 16, wherein the field stop zone 18-1 has dopants of the first conductivity type at a field stop zone dopant concentration. For example, the field stop zone 18-1 is configured to reduce the occurrence of parasitic channels within the junction termination region 14.

For example, the guard zone 17 comprises a guard subzone 17-1 that is implemented as a ring-shaped well (also referred to as guard ring) that surrounds the active region 13, as illustrated in FIG. 1. The field stop zone 18-1 may be in contact with the guard zone 17. As illustrated in FIG. 2A, also the field stop zone 18-1 can be arranged in the semiconductor body 10 such that it is within the common depth range DR of at least 1 µm along the vertical extension direction Z. For example, the total extension of the field stop zone 18-1 along the first lateral direction X amounts to at least 0.1 µm, or to at least 1 µm, or to at least 3 µm, or to at least 5 µm, or to even more than 10 µm. The field stop zone 18-1 may also exhibit the form of a ring that surrounds the body zone 16.

For example, the field stop zone dopant concentration is higher than the drift layer dopant concentration by at least a factor of 2. That factor can be even higher than 2, for example, the factor amounts to at least 3, 5, 8, 10, 50 or to even more than 100. As introductorily mentioned, the term "field stop zone dopant concentration" may refer to a mean or average dopant concentration of the field stop zone 18-1.

The drift layer dopant concentration of the drift layer 101 can be the drift layer dopant concentration that is present in a region 101-1 (cf. FIG. 1) of the drift layer 101 that is positioned below the body zone 16 at substantially half of the total extension of the drift layer 101 along the vertical extension direction Z. For example, the total extension of the drift layer 101 amounts to at least 10 µm. For example, said region 101-1 can be arranged within the active region 13 of the semiconductor device 1. Further, the dopant concentration being present within that region 101-1 can be the dopant concentration that substantially influences, at a given total extension of the drift layer 101 along the vertical extension direction, the magnitude of the blocking voltage that the pn-junction is capable of blocking. In an embodiment, the region 101-1 is the centre of the drift layer 101.

The field forming zone 18 may further comprise a low doped zone 18-2. For example, the low doped zone 18-2 is arranged adjacent to the field stop zone 18-1 and may head towards the body zone 16. The low doped zone 18-2 may have dopants of the first conductivity type at a dopant concentration that is lower than the drift layer dopant concentration, for example at least by a factor of 1.5. That factor can be even higher than 1.5, such as at least 2, 4, 10 or even greater than 100.

Figure 2B:
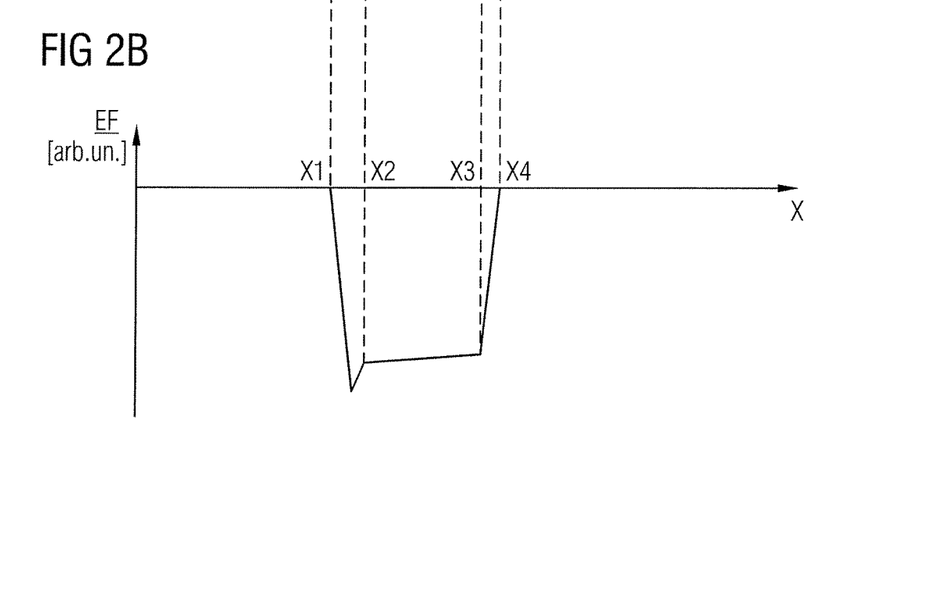
FIG. 2B schematically illustrates a course of an electrical field strength (EF) along a first lateral direction according to one or more embodiments.

Thus, the dopant concentration of the dopants of the first conductivity type changes along the first lateral direction X, for example in a region close the surface of the semiconductor body 10. For example, at an inner position X2 (cf. FIG. 2B), the dopant concentration is rather low and remains at the rather low level until the position X3, where it may rapidly change to a substantially higher level due to the field stop zone 18-2. Position X3 may mark a transition from the low doped zone 18-2 to the field stop zone 18-1 along the first lateral direction X. For example, such a lateral variation of the dopant concentration of the dopants of the first conductivity type within the field forming zone 18 arranged between the body zone 16 and the guard zone 17 may lead to a trapezoidal course of the electrical field strength EF that is present in proximity to the surface of the semiconductor body 10, as illustrated in FIG. 2B. A first peak of the electrical field strength EF between the positions X1 and X2 may be shifted in dependence of the curvature of the sidewall 16-1 of the body zone 16. Position X2 may mark a transition from the body zone 16 to the low doped zone 18-2 along the first lateral direction X at the surface of the semiconductor body 10. The field stop zone 18-1 may be configured to ensure that the electrical field strength EF is significantly reduced at a position X4, which may be within the lateral extension of the field stop zone 18-1 along the first lateral direction X, e.g., a position before or at the beginning of the guard zone 17 in proximity of the surface of the semiconductor body 10. Thus, in accordance with an embodiment, the lateral extension of the guard zone 17 does not comprise position X4 or, respectively, position X4 may mark the transition between the field stop zone 18-1 and the guard zone 17. For example, the electrical field strength EF amounts to approximately zero at position X4. For example, such course of the electrical field strength EF may allow for accommodating a higher voltage in between the body zone 16 and the guard zone 17. In other words, the field stop zone 18-1 and the low doped zone 18-2 can be configured to induce an electrical field EF that exhibits a substantial trapezoidal course along the first lateral direction X.

In an embodiment, the dopant concentration of the low doped zone 18-2 changes along the vertical extension direction Z. For example, a transition between the surface of the semiconductor body 10 and the low doped zone 18-2 along the vertical extension direction Z forms an upper transition 18-21, and a transition between the low doped zone 18-2 and the drift layer 101 along the vertical extension direction Z forms a lower transition 18-22. The dopant concentration being present at or in proximity to the upper transition 18-21 can be lower as compared to the dopant concentration being present at or in proximity to the lower transition 18-22. For example, the dopant concentration increases, e.g., in a substantially monotonous manner, along the vertical extension direction Z. The increase of the dopant concentration along the vertical extension direction Z may itself also decrease or increase along the vertical extension direction Z. The total increase of the dopant concentration along the vertical extension direction Z from the upper transition 18-21 to the lower transition 18-22 may amount to, e.g., at least 15%, to at least 20%, to at least 25%, or to even more than 30%. Thus, in accordance with an embodiment, the dopant concentration being present at the lower transition 18-22 amounts to, e.g., at least 115%, or to at least 120%, or to at least 125% or to even more than 130% of the dopant concentration being present at the upper transition 18-21.

For example, the field forming zone 18 is electrically floating; i.e., in accordance with an embodiment, none of the field stop zone 18-1 and the low doped zone 18-2 is electrically connected to a defined electrical potential.

In an embodiment, the field stop zone 18-1 is arranged adjacent to the low doped zone 18-2 along the radial direction (corresponding to the first lateral direction X in FIGS. 1 to 4). For example, the low doped zone 18-2 is arranged more closely to the body zone 16 as compared to the field stop zone 18-1. In other words, the field stop zone 18-1 may be arranged more closely to the edge region 14-1 as compared to the low doped zone 18-2.

Also the low doped zone 18-1 may be arranged within the semiconductor body 10 such that it exhibits the common depth range DR of at least 1 µm along the vertical extension direction Z, as illustrated in FIG. 2A. For example, a mean total extension of the low doped zone 18-2 along the first lateral direction X can amount to at least 2 µm, or to at least 5 µm, or to at least 10 µm, or to at least 50 µm, or to even more than 300 µm. Further, the total extension of the low doped zone 18-2 along the first lateral direction X may be greater than the total extension of the field stop zone 18-1 along the first lateral direction X. In accordance with the embodiment illustrated in FIG. 2A, the low doped zone 18-2 may be in contact with the body zone 16.

Figure 3:
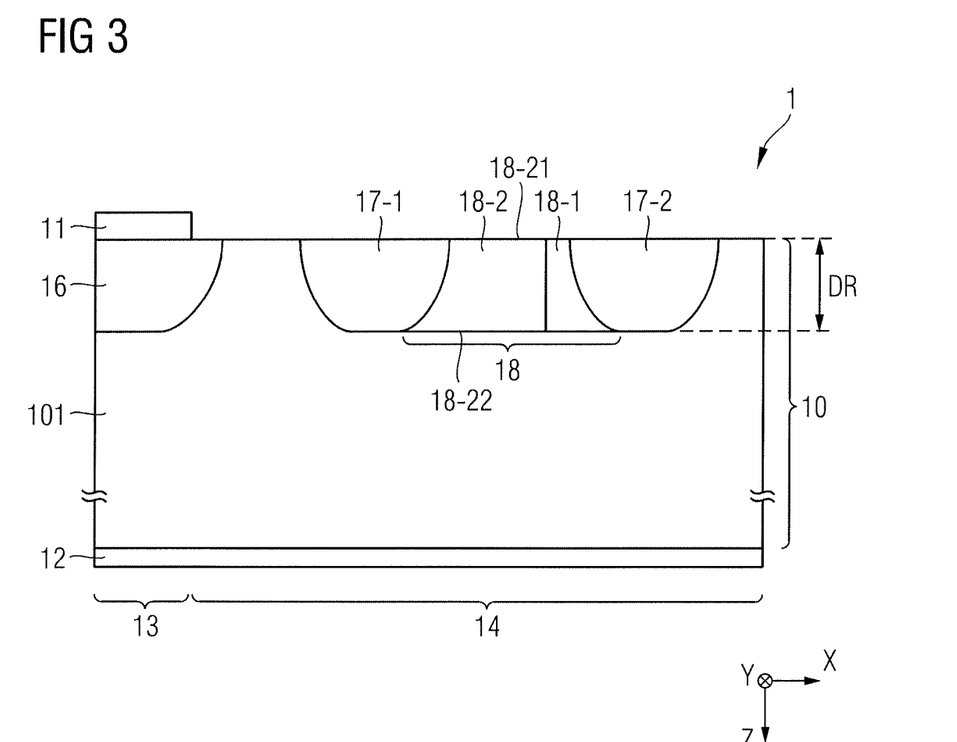
FIG. 3 schematically illustrates a section of a vertical cross-section of a semiconductor device according to one or more embodiments.

In accordance with another embodiment that is schematically and exemplarily illustrated in FIG. 3, the guard zone 17 may comprise at least two guard subzones 17-1 and 17-2, wherein the field forming zone 18 having the low doped zone 18-2 and the field stop zone 18-1 can be arranged between the first guard subzone 17-1 and the second guard subzone 17-2. As explained generally above, each of the guard subzones 17-1 and 17-2 may exhibit the form of a ring-shaped well, such as a closed ring, that surrounds the active region 13, in accordance with the embodiment of FIG. 3. In another embodiment, guard subzones 17-1 and 17-2 may be part of respective turns of a spiral or, respectively, may each exhibit the form of a non-closed ring-shaped well, as explained more generally with regards to FIG. 1.

The field stop zone 18-1 may be in contact with the second guard subzone 17-2 and the low doped zone may be in contact with the first guard subzone 17-1. Further, the semiconductor device 1 may comprise more than two guard subzones 17-1 and 17-2 with a respective field forming zone 18 arranged in between more than one or in between each pair of guard subzones. The field forming zone 18 may allow for accommodating a higher voltage in between the respective pair of guard subzones; i.e., the distance between the guard subzones can be kept comparatively low in accordance with an embodiment.

Figure 4:
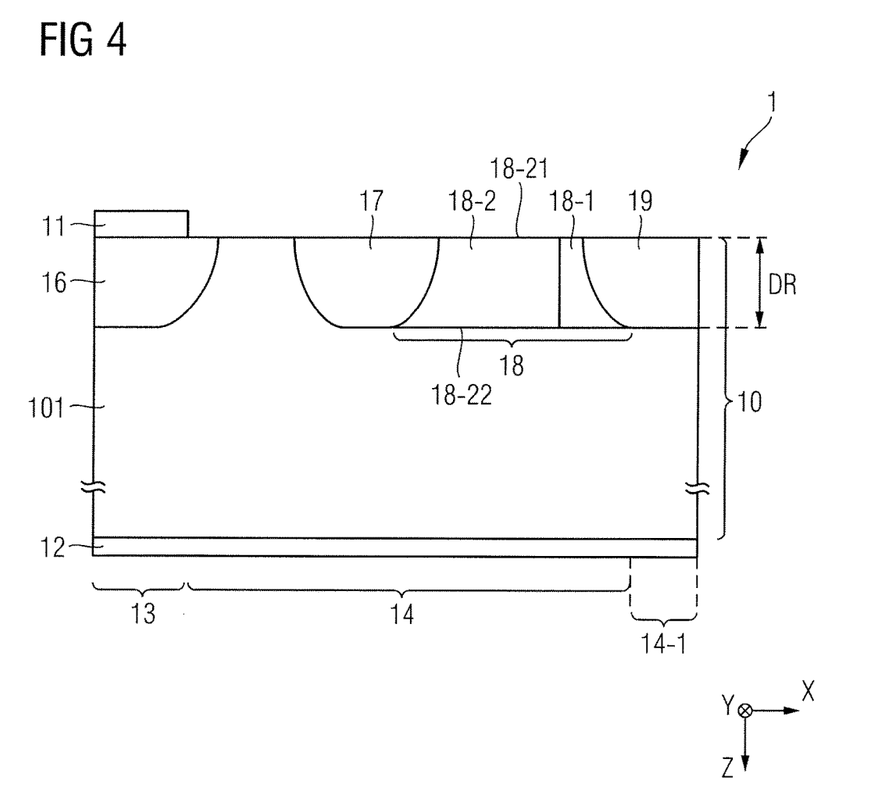
FIG. 4 schematically illustrates a section of a vertical cross-section of a semiconductor device according to one or more embodiments.

In accordance with yet a further embodiment that is schematically and exemplarily illustrated in FIG. 4, the field forming zone 18 having the low doped zone 18-2 and the field stop zone 18-1 may also be arranged between the guard zone 17 and the channel stopper zone 19. The field stop zone 18-1 may be in contact with the channel stopper zone 19 and the low doped zone may be in contact with the guard zone 17, e.g., with an outermost guard subzone of the guard zone 17.

What has been stated about the field forming zone 18 having the field stop zone 18-1 and the low doped zone 18-2 with regards to FIG. 2A and FIG. 2B, for example regarding spatial dimension, dopant concentration and the ability of inducing a substantially trapezoidal course of the electrical field strength may also apply the embodiments illustrated in FIG. 3 and FIG. 4.

It shall be understood, however, that the semiconductor device 1 may comprise, in accordance with an embodiment, a plurality of field forming zones 18. For example, a first pair of the field stop zone 18-1 and the low doped zone 18-2 may be arranged both in between the body zone 16 and the guard zone 17, a second pair of the field stop zone 18-1 and the low doped zone 18-2 may be arranged within respective two guard subzones (such as between guard subzones 17-1, 17-2) of the guard zone 17, and/or a third pair of the field stop zone 18-1 and the low doped zone 18-2 may be arranged between the guard zone 17 and the channel stopper zone 19. Thus, combinations of the embodiments illustrated in FIG. 2A, FIG. 3 and FIG. 4 are possible and what is stated about the pair of the field stop zone 18-1 and the low doped zone 18-2 may apply to every of said possibilities, if not stated otherwise.

For example, the total extension of the low doped zone 18-2 along the vertical extension direction Z and the total extension of the field stop zone 18-1 along the vertical extension direction Z have the same value, or at least approximately the same value. In accordance with another embodiment, the total extension of the low doped zone 18-2 along the vertical extension direction Z and the total extension of the field stop zone 18-1 along the vertical extension direction Z may be different from each other. For example, the total extensions of the zones 18-1 and 18-2 along the vertical extension direction differ by a factor of no more than 2. Both of the zones 18-1 and 18-2 may extend from the surface of the semiconductor body 10 along the vertical extension direction Z by a distance of at least 1 µm, for example at least 2 µm or above.

Even so FIG. 2A to FIG. 4 illustrate that each of the body zone 16, the low doped zone 18-2, the field stop zone 18-1, the guard zone 17 and the channel stopper zone 19 exhibit the same total extension along the vertical extension direction Z, it shall be understood that at least one of the total extension of the low doped zone 18-2 along the vertical extension direction Z and the total extension of the field stop zone 18-1 along the vertical extension direction Z can be within the range of 60% to 140% of the total extension of the guard zone 17 along the vertical extension direction Z.

For example, each of the total extension of the low doped zone 18-2 along the vertical extension direction Z and the total extension of the field stop zone 18-1 along the vertical extension direction Z is within the range of 60% to 140% of the total extension of the body zone 16 along the vertical extension direction Z. Further, the total extension of the guard zone 17, e.g., the total extension of each guard subzone 17-1, 17-4 of the guard zone 17, along the vertical extension direction Z can be within the range of 60% to 140% of the total extension of the body zone 16 along the vertical extension direction Z. Also, the total extension of the channel stopper zone 19 maybe within the range of 60% to 140% of the total extension of the body zone 16 along the vertical extension direction Z.

Each of the body zone 16, the guard zone 17, the field forming zone 18 and the channel stopper zone 19 can be arranged adjacent to each other in the radial direction (which is identical to the first lateral direction X in FIGS. 1, 2A, 3 and 4).

In an embodiment, the low doped zone 18-2 may comprise a proton-doped semiconductor material. For example, close to the surface of the semiconductor body 10, the proton-doped semiconductor material has dopants of the first conductivity type at a dopant concentration that is lower than the drift layer dopant concentration being present, e.g., at the half of the wafer depth in the active region 13 (c.f. region 101-1 in FIG. 1), e.g., lower by at least a factor of 1.5. As elaborated above, this factor can be even higher than 1.5. Examples of how the proton-doped semiconductor material may be created will now be given below.

In the following, a semiconductor device processing method shall be explained with respect to FIG. 5, according to which the proton-doped semiconductor material of the low doped zone 18-2 can be introduced within the semiconductor body 10.

For example, the method comprises providing a semiconductor device 1 having a first load terminal 11, a second load terminal 12 and a semiconductor body 10, wherein the semiconductor body 10 comprises an active region 13 configured to conduct a load current between the first load terminal 11 and the second load terminal 12, and a junction termination region 14 surrounding the active region 13. The provided semiconductor device 1 may further comprise a drift layer 101 arranged within both the active region 13 and the junction termination region 14 and having dopants of the first conductivity type at a drift layer dopant concentration. Also, the provided semiconductor device 1 may comprise a body zone 16, a guard zone 17 and a field stop zone 18-1, as they have been exemplarily explained with respect to the previous drawing. Thus, what has been said about the active region 13, the junction termination region 14, the drift layer 101, the body zone 16, the guard zone 17 and the field stop zone 18-1 may also apply to the semiconductor device 1 that is provided in accordance with the method exemplarily explained herein.

The semiconductor device processing method may further comprise creating, within the region of the semiconductor body 10 arranged adjacent to the field stop zone 18-1, a low doped zone 18-2 that has dopants of the first conductivity type at a dopant concentration that is lower than the drift layer concentration by carrying out at least a proton implantation.

The proton implantation may comprise implanting hydrogen. For example, during the proton implantation, e.g., in the energy range of several 100 keV to several MeV and, e.g., with a dose in the range between about $10^{13}$ cm$^{-2}$ and $10^{15}$ cm$^{-2}$, intrinsic radiation defects can be induced. Further, the proton implantation can be followed by an annealing step (also referred to as tempering) in the temperature range between about 300 to 520° C. Then, the implanted hydrogen may diffuse from its projected range through the radiation damage profile and decorate the radiation-induced defects or defect complexes, thus activating, the hydrogen-related donors.

Optional aspects involved with the step of carrying out the proton implantation shall now be explained in more detail. For example, the semiconductor body 10 is provided. The provided semiconductor body 10 may be pre-doped, for example during crystal growths, by epitaxial growth or by means of diffusion or implantation of a dopant material, such as phosphor. The semiconductor body 10 may be subjected, e.g., after structuring the junction termination region 14, to the proton implantation for creating a proton induced doping both in the drift layer 101 and the low doped zone 18-2. Further, the entire semiconductor body 10 may become proton doped during this step, e.g., also the field stop zone 18-1. A possible result of such proton implantation is schematically illustrated in the upper part of FIG. 5 (cf. reference sign 21), which exemplarily depicts the level of a hydrogen concentration H-CC along the vertical extension direction Z. For example, in an upper region of the semiconductor body 10 (cf. regions DR and 101), the hydrogen concentration H-CC is at a rather low level, wherein the hydrogen concentration H-CC exhibits a peak 21-1 at a lower region of the semiconductor body 10, for example in a region where said buffer layer 102 (cf. FIG. 1) shall be implemented. Thus, the proton implantation can be used for adjusting both the level of the drift layer dopant concentration and the dopant concentration of the low doped zone 18-2.

For example, the proton implantation is carried out with a proton dose of at least $5\times10^{13}$ cm$^{-2}$, or at least $1\times10^{14}$ cm$^{-2}$. Further, the proton dose may be kept below $5\times10^{15}$ cm$^{-2}$. Further, the proton implantation can be carried out with the proton energy of at least 2 MeV, or at least 3.5 MeV.

In an embodiment, a tempering is carried out subsequently to the proton implantation for adjusting the level of the dopant concentration of the low doped zone 18-2 and the level of the drift layer dopant concentration, for example, such that the dopant concentration of the low doped zone 18-2 is lower than the drift layer dopant concentration, e.g., lower by a factor of at least 1.5, by a factor of at least 2, by a factor of at least 3 or even lower by a factor of at least 10. Also the level of the dopant concentration of further regions of the semiconductor body may be modified by the tempering.

In accordance with an embodiment, tempering is carried out such that the dopant concentration of the low doped zone 18-2 changes along the vertical extension direction Z. For example, tempering is carried out such that the dopant concentration being present at or in proximity to the upper transition 18-21 can be lower as compared to the dopant concentration being present at or in proximity to the lower transition 18-22. For example, the dopant concentration increases, e.g., in a substantially monotonous manner, along the vertical extension direction Z. The increase of the dopant concentration along the vertical extension direction Z may itself also decrease or increase along the vertical extension direction Z, as illustrated in FIG. 5 (cf. reference sign 22, region DR). The total increase of the dopant concentration along the vertical extension direction Z from the upper transition 18-21 to the lower transition 18-22 may amount to, e.g., at least 15%, to at least 20%, to at least 25%, or to even more than 30%. Thus, in accordance with an embodiment, tempering is carried out such that the dopant concentration being present at the lower transition 18-22 amounts to at least, e.g., 115%, or to at least 120%, or to at least 125%, or to even more than 130% of the dopant concentration being present at the upper transition 18-21.

For example, the tempering is carried out at a temperature of at least 450° C. for at least 30 min. The tempering may also take more time than one hour, e.g., at least 1.5 hours, at least two hours, at least four hours, or even about ten hours or more than ten hours. Further, the tempering temperature may amount to more than 450° C., such as at least 500° C., or even more than 520° C. For example, the tempering temperature does not exceed 550° C.

Figure 5:
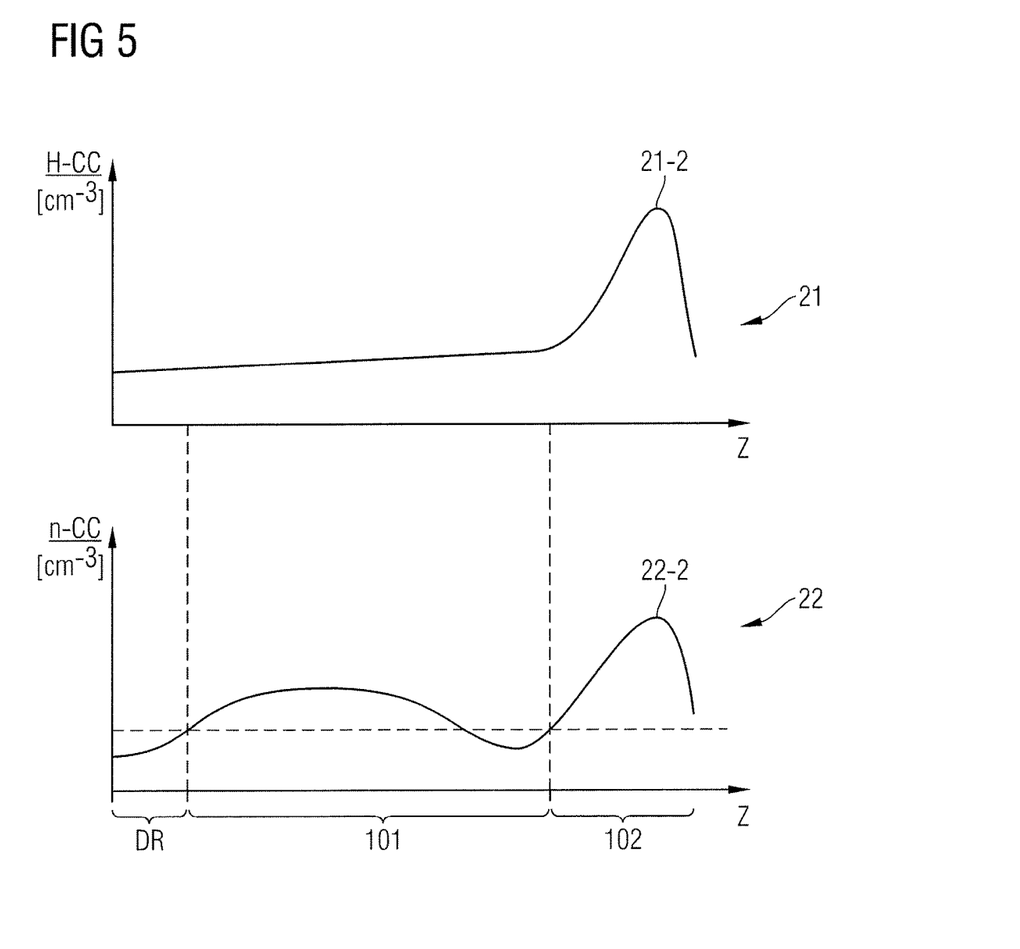
FIG. 5 schematically illustrates a course of a hydrogen concentration (H-CC) and a course of a dopant concentration (n-CC) along a vertical extension direction according to one or more embodiments.

A possible result of such tempering is schematically illustrated in the lower part of FIG. 5 (cf. reference sign 22), which exemplarily depicts the level of an n-dopant concentration n-CC along the vertical extension direction Z. Thus, the tempering may lead to an n-dopant concentration n-CC that exhibits a course as exemplarily illustrated in the lower part of FIG. 5. Accordingly, the dopant concentration of the dopants of the first conductivity type is rather low within the common depth range DR and increases within the level of the drift layer 101, as illustrated in FIG. 5.

Within the level of the semiconductor body 10 where the buffer layer 102 can be implemented, the dopant concentration n-CC may exhibit a peak 22-2. For example, this peak 22-2 achieves the comparatively high dopant concentration of the buffer layer 102. In another embodiment, parts of the backside of the semiconductor body 10 are removed by abrasion so as to 2 completely or at least partially remove the layer comprising the peak 22. Then, the backside may be processed, e.g., so as to produce the buffer layer 102 by carrying out a separate doping step. Further, it shall be understood that the buffer layer 102 must not necessarily be present within the semiconductor device 1.

In an embodiment, at least one of a masked phosphor implantation, a masked proton implantation, and a masked oxygen implantation is carried out, e.g., after the tempering, for adjusting, e.g., increasing, the level of the dopant concentration of the field stop zone 18-1. Thereby, the dopant concentration of the filed stop zone 18-1 may be greater than the drift layer dopant concentration by a factor of at least 2, or even higher, as illustrated above.

Further, a front side metallization can be deposited for creating the first load terminal 11. Also, after having processed the junction termination region 14, the surface of the semiconductor body 10 may be sealed off with the passivation layer 15, which may be made of silicon dioxide or polyamide, among others.

In an embodiment, the following dopant concentrations may be present with in the semiconductor body 10: The dopant concentration of the drift layer 101 may be in the range of $10^{13}$ to $10^{15}$ cm$^{-3}$; the dopant concentration of the body zone 16 may be in the range of $10^{17}$ to $10^{19}$ cm$^{-3}$; the dopant concentration of the guard zone 17 (e.g., the dopant concentration of each guard subzone) may be in the range of $10^{17}$ to $10^{19}$ cm$^{-3}$; the dopant concentration of the channel stopper zone 19 may be in the range of $10^{17}$ to $10^{19}$ cm$^{-3}$; the dopant concentration of the field stop zone 18-1 may be in the range of $10^{14}$ to $10^{16}$ cm$^{-3}$; and the dopant concentration of the low doped zone 18-2 may be in the range of $10^{12}$ to $3 \times 10^{13}$ cm$^{-3}$.

In accordance with the embodiments explained above with respect to FIGS. 1 to 5, a semiconductor device can be provided that exhibits a junction termination region that allows for high blocking capabilities of the semiconductor device on the one side and that has low space requirement. Further, the occurrence of parasitic channels can be reduced.

Features of further embodiments are defined in the dependent claims. The features of further embodiments and the features of the embodiments described above may be combined with each other for forming additional embodiments, as long as the features are not explicitly described as being alternative to each other.

Even though FIG. 2A, FIG. 3 and FIG. 4 schematically illustrate possible set-ups of the semiconductor device 1 in a section of vertical cross-section along a plane Z-X, it shall be understood that the junction termination region 14 and the edge region 14-1 of the embodiments described with respect to FIG. 2A, FIG. 3 and FIG. 4 may each exhibit a configuration that is arranged radial-symmetrically with regards to a radial direction that is in parallel to the surface of the semiconductor body and that points from a centre of the active region 13 to the edge region 14-1 of the semiconductor device 1. Such radial-symmetrical configuration is schematically illustrated in FIG. 1. This radial direction may thus comprise the first lateral direction X and the second lateral direction Y. In other words, each of the zones 17 (e.g., including the one or more subzones 17-1 to 17-4), 18 and 19 may exhibit the form of a ring-shaped well that surrounds the active region and that follows a course, e.g., in a direction perpendicular to the radial direction. Of course, such form must not necessarily exhibit a strictly circular course, but may also be established by four sections, two of which are aligned along the first lateral direction X and the other two of which are aligned along the second lateral direction Y, as schematically illustrated in FIG. 1. Optionally, the edges between said sections can be rounded.

In the above, embodiments pertaining to semiconductor wafers and to methods and systems for processing a semiconductor wafer were explained. For example, these semiconductor wafers are based on silicon (Si). Accordingly, a monocrystalline semiconductor region or layer, e.g., the semiconductor body 10 that may include the semiconductor regions 103, 102, 101 and the semiconductor zones 16, 17, 18 and 19 of exemplary embodiments, can be a monocrystalline Si-region or Si-layer or Si-zones. In other embodiments, polycrystalline or amorphous silicon may be employed.

It should, however, be understood that the semiconductor regions 103, 102, 101, 16, 17, 18 and 19 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (Si$_x$C1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:
1. A semiconductor device having a first load terminal, a second load terminal and a semiconductor body, the semiconductor body comprising an active region configured to conduct a load current between the first load terminal and the second load terminal and a junction termination region surrounding the active region, wherein the semiconductor body includes
  a drift layer arranged within both the active region and the junction termination region and having dopants of a first conductivity type at a drift layer dopant concentration of equal to or less than $10^{14}$ cm$^{-3}$;
  a body zone arranged in the active region and having dopants of a second conductivity type complementary to the first conductivity type and isolating the drift layer from the first load terminal;
  a guard zone arranged in the junction termination region and having dopants of the second conductivity type and being configured to extend a depletion region formed by a transition between the drift layer and the body zone;
a field stop zone arranged adjacent to the guard zone, the field stop zone having dopants of the first conductivity type at a field stop zone dopant concentration that is higher than the drift layer dopant concentration by a factor of at least 2; and
a low doped zone arranged adjacent to the field stop zone, the low doped zone having dopants of the first conductivity type at a dopant concentration that is lower than the drift layer dopant concentration by a factor of at least 1.5, wherein the body zone, the guard zone, the field stop zone and the low doped zone are arranged in the semiconductor body such that they exhibit a common depth range of at least 1 µm along a vertical extension direction.

2. The semiconductor device of claim 1, wherein both the field stop zone and the low doped zone are arranged in between the body zone and the guard zone.

3. The semiconductor device of claim 1, wherein the drift layer dopant concentration is the drift layer dopant concentration present in a region of the drift layer that is positioned within the active region underneath the body zone at substantially half of the total extension of the drift layer along the vertical extension direction.

4. The semiconductor device of claim 1, wherein the field stop zone and the low doped zone are configured to induce an electrical field strength that exhibits a substantially trapezoidal course along a first lateral direction.

5. The semiconductor device of claim 1, wherein the body zone and the drift layer form a pn-junction configured to block a blocking voltage in a blocking state of the semiconductor device.

6. The semiconductor device of claim 1, wherein the dopant concentration of the low doped zone increases along the vertical extension direction from an upper transition to a lower transition by at least 15%.

7. The semiconductor device of claim 1, wherein the low doped zone is in contact with the field stop zone and non-overlapping with the field stop zone.

8. A semiconductor device having a first load terminal, a second load terminal and a semiconductor body, the semiconductor body comprising an active region configured to conduct a load current between the first load terminal and the second load terminal and a junction termination region surrounding the active region, wherein the semiconductor body includes
a drift layer arranged within both the active region and the junction termination region and having dopants of a first conductivity type at a drift layer dopant concentration;
a body zone arranged in the active region and having dopants of a second conductivity type complementary to the first conductivity type and isolating the drift layer from the first load terminal;
a guard zone arranged in the junction termination region and having dopants of the second conductivity type and being configured to extend a depletion region formed by a transition between the drift layer and the body zone;
a field stop zone arranged adjacent to the guard zone, the field stop zone having dopants of the first conductivity type; and
a low doped zone arranged adjacent to the field stop zone, the low doped zone comprising a proton-doped semiconductor material having dopants of the first conductivity type at a dopant concentration that is lower than the drift layer dopant concentration, and wherein the body zone, the guard zone, the field stop zone and the low doped zone are arranged in the semiconductor body such that they exhibit a common depth range of at least 1 µm along a vertical extension direction.

9. The semiconductor device of claim 8, wherein both the field stop zone and the low doped zone are arranged in between the body zone and the guard zone.

10. The semiconductor device of claim 8, wherein the drift layer dopant concentration is the drift layer dopant concentration present in a region of the drift layer that is positioned within the active region underneath the body zone at substantially half of the total extension of the drift layer along the vertical extension direction.

11. The semiconductor device of claim 8, wherein the field stop zone and the low doped zone are configured to induce an electrical field strength that exhibits a substantially trapezoidal course along a first lateral direction.

12. The semiconductor device of claim 8, wherein the dopant concentration of the low doped zone increases along the vertical extension direction from an upper transition to a lower transition by at least 15%.

13. The semiconductor device of claim 8, wherein the low doped zone is in contact with the field stop zone and non-overlapping with the field stop zone.

14. A semiconductor device processing method comprising
providing a semiconductor device having a first load terminal, a second load terminal and a semiconductor body, the semiconductor body comprising
an active region configured to conduct a load current between the first load terminal and the second load terminal, and a junction termination region surrounding the active region,
a drift layer arranged within both the active region and the junction termination region and having dopants of a first conductivity type at a drift layer dopant concentration;
a body zone arranged in the active region and having dopants of a second conductivity type complementary to the first conductivity type and isolating the drift layer from the first load terminal;
a guard zone arranged in the junction termination region and having dopants of the second conductivity type and being configured to extend a depletion region foiined by a transition between the drift layer and the body zone;
a field stop zone arranged adjacent to the guard zone, the field stop zone having dopants of the first conductivity type; and
creating, within a region of the semiconductor body arranged adjacent to the field stop zone, a low doped zone having dopants of the first conductivity type at a dopant concentration that is lower than the drift layer dopant concentration by carrying out at least a proton implantation, wherein the body zone, the guard zone, the field stop zone and the low doped zone are arranged in the semiconductor body such that they exhibit a common depth range of at least 1 µm along a vertical extension direction.

15. The method of claim 14, wherein the semiconductor body is subjected to the proton implantation for creating a proton induced doping in both the drift layer and the low doped zone.

16. The method of claim 14, wherein the proton implantation is carried out at with proton dose of at least $5\times10^{13}$ cm$^{-2}$.

17. The method of claim 14, wherein the proton implantation is carried out with a proton energy of at least 2 MeV.

18. The method of claim 14, further comprising carrying out a tempering subsequent to the proton implantation for adjusting the level of the dopant concentration of the low doped zone and the level of the drift layer dopant concentration such that the dopant concentration of the low doped zone is lower than the drift layer dopant concentration.

19. The method of claim 18, wherein the tempering is carried out at a temperature of at least 450° C. for at least 30 min.

20. The method of claim 14, further comprising carrying out at least one of a masked phosphor implantation, a masked proton implantation, and a masked oxygen implantation for adjusting a dopant concentration of the field stop zone.

\* \* \* \* \*